United States Patent [19]

Hong et al.

[11] Patent Number: 5,721,705
[45] Date of Patent: Feb. 24, 1998

[54] CIRCUITRY FOR CONTROLLING A THRESHOLD VOLTAGE IN A FLASH MEMORY CELL

[75] Inventors: Soon Won Hong, Seoul; Jae Hyun Sone, Kyungki-Do, both of Rep. of Korea

[73] Assignee: Hyundai Electronics Industries Co., Ltd., Kyungki-Do, Rep. of Korea

[21] Appl. No.: 769,507

[22] Filed: Dec. 19, 1996

[30] Foreign Application Priority Data

Dec. 20, 1995 [KR] Rep. of Korea .................. 95-52513

[51] Int. Cl.[6] .................................................. G11C 16/06
[52] U.S. Cl. .................. 365/185.24; 365/185.2; 365/185.33
[58] Field of Search .................... 365/185.2, 185.24, 365/185.33

[56] References Cited

U.S. PATENT DOCUMENTS

| | | | |
|---|---|---|---|
| 5,200,919 | 4/1993 | Kaya | 365/185.24 |
| 5,359,558 | 10/1994 | Chang et al. | 365/185.3 |
| 5,396,468 | 3/1995 | Harari et al. | 365/218 |
| 5,526,315 | 6/1996 | Kaya et al. | 365/185.18 |
| 5,566,111 | 10/1996 | Choi | 365/185.22 |
| 5,596,528 | 1/1997 | Kaya et al. | 365/185.24 |

*Primary Examiner*—David C. Nelms
*Assistant Examiner*—Andrew Q. Tran
*Attorney, Agent, or Firm*—Fish & Richardson P.C.

[57] ABSTRACT

The circuit for controlling the threshold voltage in the flash memory cell according to the present invention comprises a circuit for generating a first voltage depending on the amount of a drain current in the memory cell; a first element for comparing the first voltage with a reference voltage and for generating a second voltage; and a second element for supplying a control gate voltage for the control gate of the memory cell depending on the second voltage.

3 Claims, 2 Drawing Sheets

CIRCUITRY FOR CONTROLLING A THRESHOLD VOLTAGE IN A FLASH MEMORY CELL

FIELD OF THE INVENTION

The present invention relates to a circuit for controlling a threshold voltage in a flash memory cell, and more particularly to a circuit for controlling a threshold voltage in a flash memory cell, which can control precisely the threshold voltage of the flash memory cell.

BACKGROUND OF THE INVENTION

In general, when the flash memory cell is programmed, the threshold voltages of the cells of which programming has been completed are different from each other. In addition, when the flash memory cell has been erased, the threshold voltages of the cells of which erasure has been completed are different from each other. FIG. 1A shows distribution of threshold voltages in the cells when the flash memory is actually programmed and erased. As shown in FIG. 1A, the threshold voltage values of the programmed cells are different from each other and the threshold voltage values of the erased cells are also different from each other.

As shown in FIG. 1B, it is ideal that the threshold voltage values of the programmed cells are same and those of the erased cells are same. As being extremely difficult to manufacture those cells, however, it is difficult to store a plurality of bits of information into a single cell.

SUMMARY OF THE INVENTION

Accordingly, it is an object of the present invention to provide a circuit for controlling a threshold voltage in a flash memory cell, which allows the threshold voltage in the flash memory cell to be controlled precisely, therefore, the above mentioned problem can be solved.

To achieve the above object, a circuit for controlling a threshold voltage in a memory cell according to the present invention comprises:

- a circuit for generating a first voltage depending on the amount of a drain current in a memory cell;
- a first element for generating a second voltage by comparing the first voltage of the circuit with a reference voltage; and
- a second element for supplying a control gate voltage to a control gate in the memory cell depending on the second voltage of the first element.

BRIEF DESCRIPTION OF THE DRAWINGS

Other objects and advantages of the present invention will be understood by reading the detailed explanation of the embodiment with reference to the accompanying drawings in which.

DESCRIPTION OF THE INVENTION

According to the present invention, the threshold voltage of the flash memory cell can be controlled precisely.

The present invention will be described below in detail by reference to the accompanying drawing.

Figure 1A:
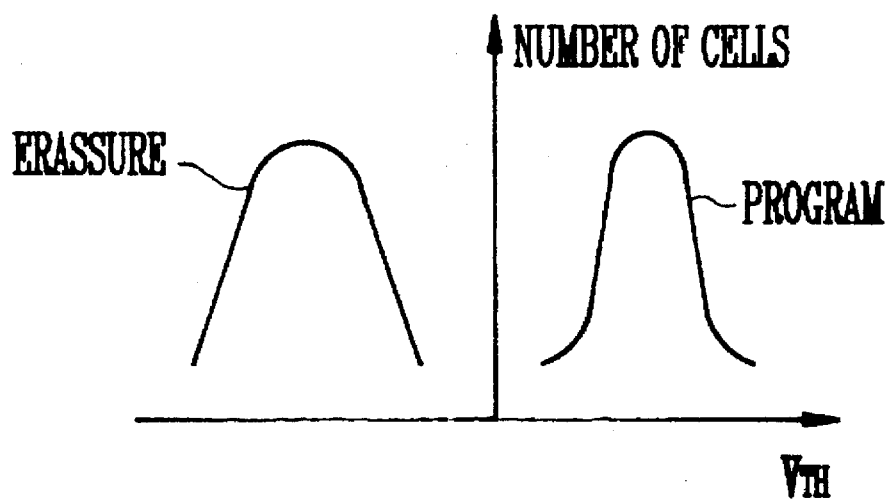
FIG. 1A shows distribution of threshold voltages in conventional flash memory cells.
Figure 1B:
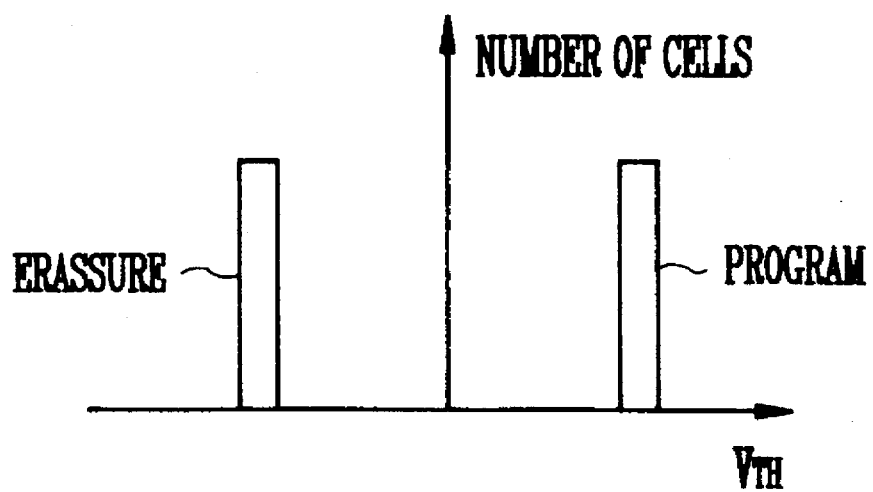
FIG. 1B shows distribution of threshold voltages in ideal flash memory cells.
Figure 2:
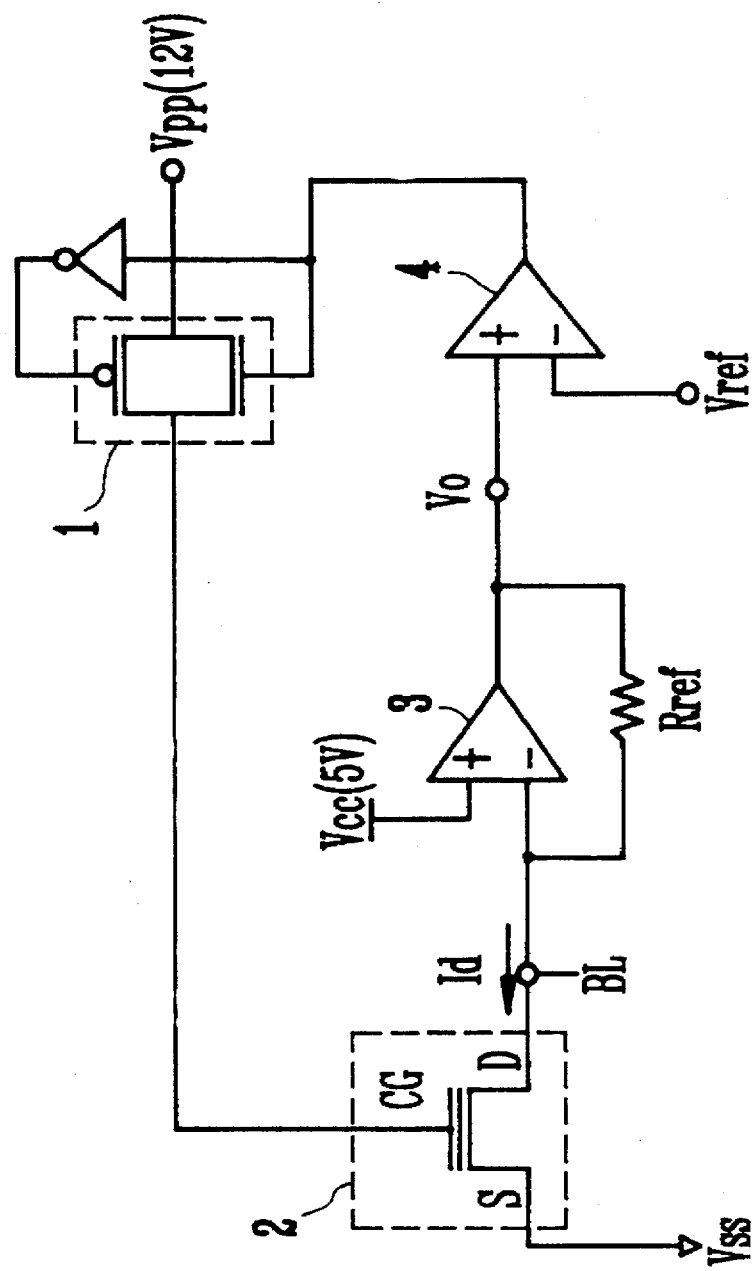
FIG. 2 illustrates a circuit diagram for controlling a threshold voltage of a flash memory cell according to the present invention.

FIG. 2 illustrates a circuit diagram for controlling a threshold voltage in a flash memory cell according to the present invention.

The threshold voltages of all the cells can be lowered by a sector erasure method. That is, all the cells are erased to have lower value of the threshold voltage than that of a given threshold voltage. As all the cells are erased and then kept to be a low threshold voltage state, a high current Id flows to the ground Vss passing through the memory cell 2 via a bit line BL. As a transmission gate 1 is initially turned on, the threshold voltage of the memory cell 2 is increased by injecting hot electrons. At the output terminal of the OP amplifier 3 of which a non-inverse terminal is supplied with a VCC power supply and an inverse terminal is connected to the drain electrode of the memory cell, a voltage (Vo=Id*Rref) which is obtained by multiplying the value of the reference resister Rref by the current Id is output and input into any one of the input terminals of the comparator 4. Also, the reference voltage Vref is input into the another of the input terminals of the comparator 4. Then the reference resistance Rref is set so that the initial voltage Vo in the OP amplifier 3 is higher than that of the reference voltage Vref. If the output voltage Vo in the OP amplifier 3 is higher than the reference voltage Vref, the comparator 4 outputs a high voltage (a high state). The transmission gate 1 into which the output voltage of the comparator 4 is input, is kept at a turn-on state. Therefore as the voltage (Vpp=12V) is continue to be supplied into the control gate CG in the memory cell 2, the threshold voltage in the memory cell 2 continues to increase.

However, after a given period of time has elapsed at the initial state, the threshold voltage in the memory cell 2 increases and the current Id flowing through the memory cell 2 decreases. Accordingly, the output voltage Vo in the OP amplifier 3 also decreases. When the value of the output voltage Vo in the OP amplifier 3 is lower than that of the reference voltage Vref due to decrease of the current Id, the comparator 4 outputs a low voltage (a low state). The transmission gate 1 into which the output voltage of the comparator 4 is input, is turned off. Accordingly, as the voltage (Vpp=12V) supplied into the control gate CG in the memory cell 2 is shut off, the threshold voltage in the memory cell 2 is not increased but kept to be constant.

When the above circuit is applied for all the memory cells, all the memory cells have a single threshold voltage determined by the reference resister Rref and the reference voltage Vref. Also, if the characteristics in the OP amplifier 3, the comparator 4 and the transmission gate 1 are ideal, the threshold voltages in the memory cells have a very narrow distribution. Also, as the threshold voltage in the memory cell 2 can be determined by the reference resister Rref and the reference voltage Vref, the memory cell 2 can be controlled to have a given threshold voltage. Accordingly, a number of bits of information can be stored on a single memory cell by using a freely controlled threshold voltage and a extremely narrow distribution of the threshold voltage.

As mentioned above, as the threshold voltage $V_T$ in the flash memory cell can be precisely controlled, the circuit can be simplified and the operational characteristic can be improved without worrying about an over-erasure and distribution of the threshold voltage. In addition, the present invention has an outstanding effect which can overcome a difficulty in designing a circuit, especially in designing a sense amplifier because the threshold voltage can be controlled freely, thereby attaining a high degree of integration.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

We claim:

1. A circuitry for controlling a threshold voltage in a flash memory cell comprising:

a circuit generating a first voltage depending on the mount of a drain current in said memory cell;

a first element generating a second voltage by comparing the first voltage of said circuit with a reference voltage; and a second element supplying a control gate voltage to a control gate of said memory cell depending on the second voltage of said first element.

2. The circuitry claimed in claim 1 wherein said circuit comprises an operational amplifier of which a non-inverse terminal is supplied with a power supply, an inverse terminal is connected to the memory cell and the output terminal is connected to said first element and a reference resister connected between said output terminal of said operational amplifier and said inverse terminal of said operational amplifier.

3. The circuitry claimed in claim 2, wherein said reference resister is set so that the first voltage is higher than the reference voltage when said memory cell is erased to a lower threshold voltage than a desired threshold voltage.

* * * * *